United States Patent
Hsu et al.

(10) Patent No.: US 6,747,401 B2
(45) Date of Patent: Jun. 8, 2004

(54) AUGMENTING SURFACE ELECTRODE FOR PIEZOELECTRIC WORKPIECE

(75) Inventors: Yu-Hsiang Hsu, Taipei (TW);
Wen-Hsin Hsiao, Taichung (TW);
Wen-Jong Wu, Taipei (TW);
Chih-Kung Lee, Taipei (TW)

(73) Assignee: Advancewave Technology, Inc., Taipei (TW)

( * ) Notice: Subject to any disclaimer, the term of this patent is extended or adjusted under 35 U.S.C. 154(b) by 20 days.

(21) Appl. No.: 10/064,465

(22) Filed: Jul. 17, 2002

(65) Prior Publication Data

US 2004/0000846 A1 Jan. 1, 2004

(30) Foreign Application Priority Data

Jul. 1, 2002 (TW) ........................ 91114481 A

(51) Int. Cl.$^7$ .................. H01L 41/107; H01L 41/08
(52) U.S. Cl. ............... 310/359; 310/358; 310/367
(58) Field of Search ................... 310/358, 359

(56) References Cited

U.S. PATENT DOCUMENTS 5,701,049 A * 12/1997 Kanayama et al. ......... 310/359

FOREIGN PATENT DOCUMENTS

| JP | 2001339107 A | * | 12/2001 | ........ | H01L/41/107 |
| WO | WO 9521463 A1 | * | 8/1995 | ........... | H01L/41/08 |
| WO | WO 9819348 A1 | * | 5/1998 | ........ | H01L/41/107 |

* cited by examiner

Primary Examiner—Burton S. Mullins
Assistant Examiner—J. Aguirrechea
(74) Attorney, Agent, or Firm—Jiang Chyun IP Office

(57) ABSTRACT

Augmenting surface electrodes for piezoelectric workpieces together with the method for fabrication are disclosed for improving fabrication and operation reliability of the workpieces. A piezoelectric workpiece used for energy conversion between electrical and mechanical forms in a piezoelectric system comprises a body, a number of function electrodes, and at least an augmenting surface electrode. The body of piezoelectricity is used for implementing the energy conversion. The function electrodes are each fixedly attached to the surface of the body, and are connected in the electric circuit for implementing the energy conversion. At least one of the function electrodes has a shape with a contour of at least one acute angle. At least an augmenting surface electrode has a substantially elongated shape fixedly attached to the surface of the body proximate to the acute angle. Together, the augmenting surface electrode and the proximate function electrode thereof constitute a gross electrode that substantially cancels the acute angle when both are connected electrically to the same electric potential. The acute angle is cancelled during the polarization of electric dipoles of the body grain molecules so that the boundary region between different polarization orientation distribution regions can be smoothed. The reliability of the piezoelectric workpiece is improved both during the fabrication and during normal operation of the workpiece.

11 Claims, 8 Drawing Sheets

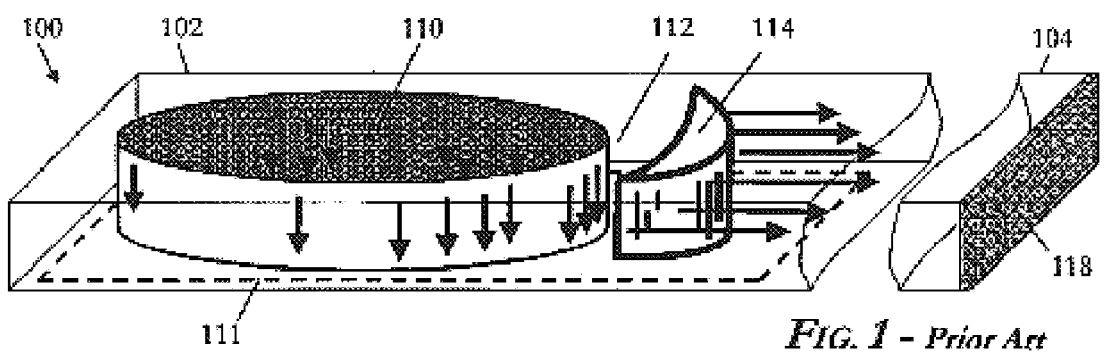
FIG. 1 - Prior Art
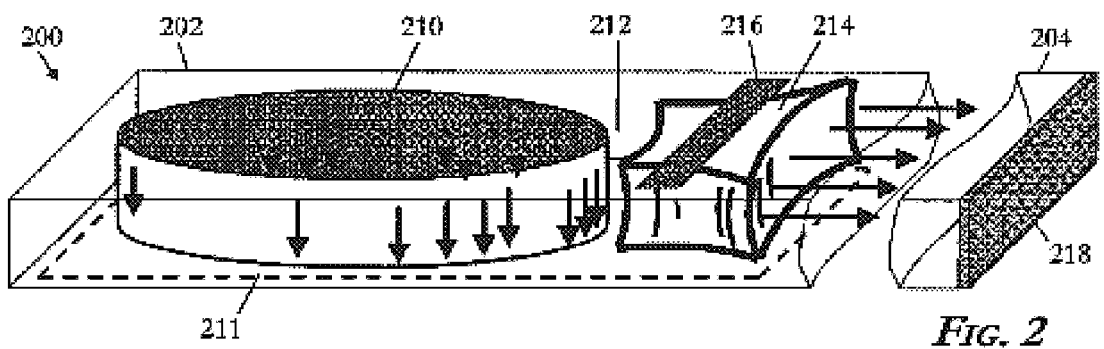
FIG. 2

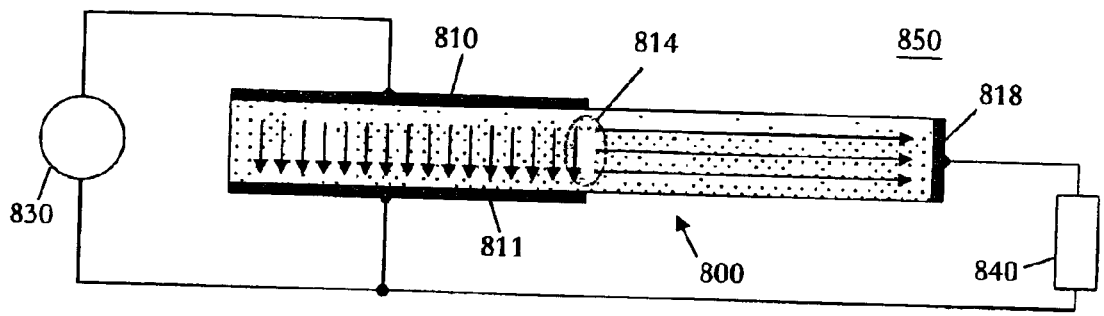
FIG. 8 - Prior Art
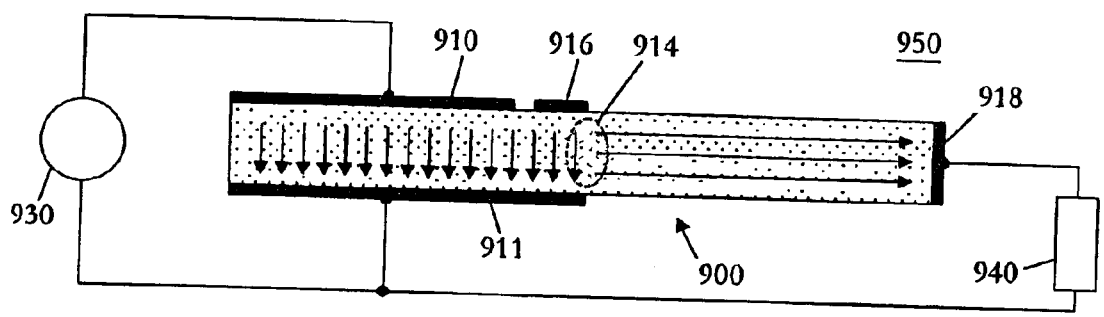
FIG. 9

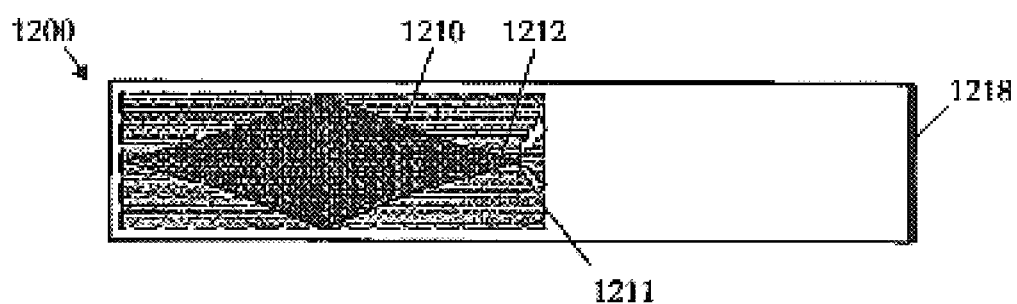
FIG. 12 - Prior Art
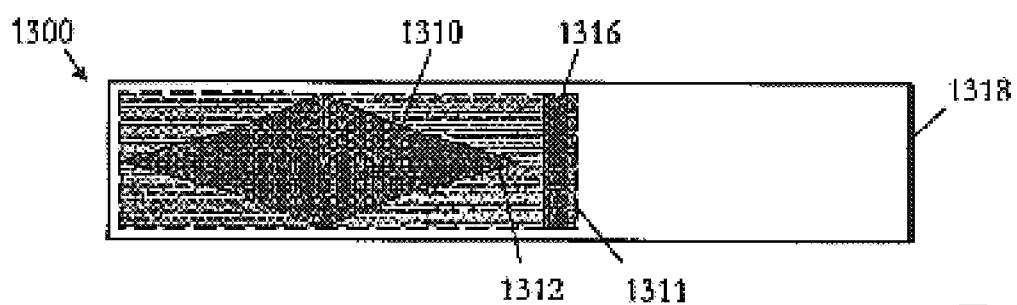
FIG. 13

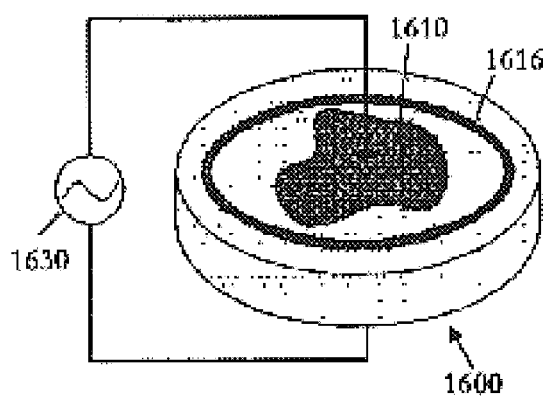 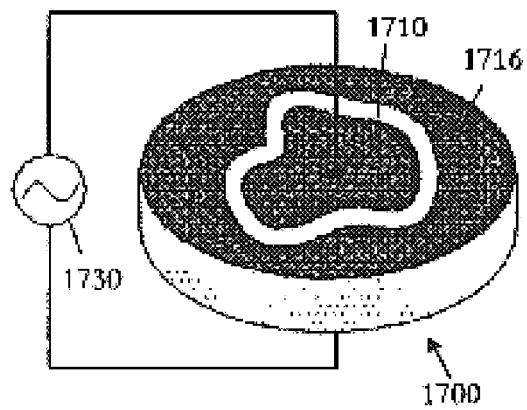
FIG. 16                                      FIG. 17

AUGMENTING SURFACE ELECTRODE FOR PIEZOELECTRIC WORKPIECE

CROSS REFERENCE TO RELATED APPLICATIONS

This application claims the priority benefit of Taiwan application serial no. 91114481, filed on Jul. 1, 2002.

BACKGROUND OF INVENTION

1. Field of the Invention

This invention relates in general to piezoelectricity and, in particular, to the protection and reliability improvement of piezoelectric workpieces utilizing augmenting surface electrodes.

2. Technical Background

Piezoelectricity is useful in various applications. With the advancements in material science and microelectronic technology, piezoelectric apparatuses are found in ever more equipment, either scientific, industrial, or commercial. Typical examples include piezoelectric transformer in the power system of portable devices such as notebook computers, personal digital assistant (PDA), and cellular phones, accelerometer and gyroscope for commercial navigation devices and piezoelectric signal filter in industrial sensory and control systems, among others.

Workpieces of different physical shapes and sizes of the piezoelectric nature are the center core of piezoelectric systems. Piezoelectric workpieces are made of materials capable of being fabricated to exhibit piezoelectricity. Typically, selected powdered material such as lead zirconate titanate (PZT) is made into the piezoelectric workpiece of the desired shape and size in a sintering-based fabrication procedure. During the high-temperature sintering phase, grains in a molded workpiece are grown. For some commercial piezoelectric material, sintering brings up useful piezoelectricity, but for many others, further processing is necessary. For these materials, a bulk workpiece does not possess piezoelectricity until it is processed in a polarization procedure.

Thermal polarization procedures generally known as poling are employed to orient the electric dipoles in the grain molecules of the workpiece. The aim is so that the grain molecules, in the bulk, exhibit a gross polarization that in general conforms to the desired orientation field pattern of the piezoelectric device for certain designed operating characteristics. To implement the polarization processing on the workpiece under fabrication, electric fields of relatively high voltage are necessary. High voltage needs to be supplied across electrodes adhered (fixedly attached) to the surface of the workpiece for a prolonged period of time so as to facilitate the poling.

One obvious problem with the conventional technique of piezoelectric workpiece fabrication is related to the above-mentioned high-voltage poling. In general, the electrodes used for polarization processing are also the functional electrodes of the same workpiece for its future normal operation. Considering that the polarization voltage is, typically, several to tens of times that of the voltage that will be present across the function electrodes of the workpiece during normal operation, it is likely that the polarization processing during fabrication, if not designed properly, becomes damaging to the workpiece itself. Two possible causes are responsible for such destructive polarization processing results accompanying the relatively-high polarization voltage.

The first is understood to be related to the uneven internal body stress arising from the poling of molecular electric dipoles in the workpiece. As the poling is implemented for an extended period of time, material crystalline grains within the workpiece located between the electrodes supplied with a high electric potential difference are gradually polarized. As the electric dipoles of those grains are gradually polarized, the grains also exhibit an ever more significant piezoelectricity.

Gradually, the workpiece thus experiences partial piezoelectric deformation in the body portion generally between the poling electrodes. Since, as mentioned, this poling voltage is times higher than that of normal operation, such partial structural deformation is likely to create significant internal mechanical stress in the boundary region where the polarized and un-polarized regions meet. Such body stress is sometimes sufficient to break the workpiece into pieces. This is particularly the case if one or more of the electrodes for a piezoelectric workpiece are patterned into shapes with acute angles. Such electrode shape patterns are more likely to induce high regional concentrations of internal mechanical stress within the piezoelectric workpiece.

The second cause is in relation to the phenomenon of point discharge across the electrodes used for polarization processing. This, also, is particularly true if an electrode for a piezoelectric workpiece is patterned into a shape with acute angles to induce point discharge during polarization processing. A point discharge during the poling processing of workpiece fabrication is likely to be catastrophic since the body of the workpiece may be fatally broken apart into pieces. Surge current in association with a point discharge across electrodes of a piezoelectric workpiece inevitably gives rise to abrupt increase in local body mechanical stress along the path of the discharge current. Frequently, as had been observed, such an abrupt regional stress increase breaks up the workpiece into pieces.

After fabrication, operation of a piezoelectric workpiece, as is well known, involves the mechanical/electrical energy conversion. Sustained and reliable operation of a workpiece in a piezoelectric system is dependent on several factors. Among these factors, the bulk physical structural characteristics in the workpiece is an important one.

Although the electric voltages in relation to the operation of a piezoelectric workpiece are relatively much lower than those employed during the fabrication phase for the same workpiece, however, a workpiece is only exposed to fabrication electric fields for the matter of a few, hours. By contrast, reliable operation of a piezoelectric system requires that the workpiece be used for thousands of hours. Thus, stress concentration build-ups within the body of a piezoelectric workpiece not sufficient to fail the device during the fabrication phase may still fail the device during prolonged periods of normal operation. For example, if the piezoelectric device is operated in non-optimized modes, the internal heat build-up is a likely factor to amplify the mechanical stress concentration to a level sufficient to fail the device.

For the foregoing reasons, there is a need for a method to avoid the formation of regions with abrupt polarization orientation alteration inside the body of a piezoelectric workpiece that may lead to mechanical stress concentrations and eventually result in structural failure, either during the manufacturing phase or during normal operation.

There is also a need for a method to smooth the polarization orientation alterations inside the body of a piezoelectric workpiece that prevents the build-up of mechanical stress concentrations to damaging levels, either during the manufacturing phase or during normal operation.

SUMMARY OF INVENTION

The invention is directed to augmenting surface electrodes for piezoelectric workpieces for improving fabrication and operation reliability thereof. Augmenting surface electrodes for piezoelectric workpieces together with the method for the workpiece fabrication are disclosed. A piezoelectric workpiece used for energy conversion between electrical and mechanical forms in a piezoelectric system comprises a body, a number of function electrodes, and at least an augmenting surface electrode. The body of piezoelectricity is used for implementing the energy conversion. The function electrodes are each fixedly attached to the surface of the body, and are connected in the electric circuit for implementing the energy conversion. At least one of the function electrodes has a shape with a contour of at least one acute angle. At least an augmenting surface electrode has a substantially elongated shape fixedly attached to the surface of the body proximate to the acute angle. Together, the augmenting surface electrode and the proximate function electrode thereof constitute a gross electrode that substantially cancels the acute angle when both are connected electrically to the same electric potential. The acute angle is cancelled during the polarization of electric dipoles of the body grain molecules so that the boundary region between different polarization orientation distribution regions can be smoothed.

BRIEF DESCRIPTION OF DRAWINGS

These and other features, aspects, and advantages of the invention will become better understood with regard to the following description, appended claims, and accompanying drawings where:

FIG. 1 schematically illustrates the abrupt alteration of the electric dipole polarization field inside the structural body of a piezoelectric workpiece in the region proximate to an acute-angled area of a function electrode;

FIG. 2 schematically illustrates the smoothing of the polarization field inside the structural body of a piezoelectric workpiece of FIG. 1 in the region proximate to the acute-angled area of the function electrode in accordance with an embodiment of the present invention;

FIG. 8 schematically illustrates the cross-section of a piezoelectric workpiece without the augmenting surface layer;

FIG. 9 schematically illustrates the piezoelectric workpiece of FIG. 8 having incorporated an augmenting surface layer in accordance with an embodiment of the present invention;

FIG. 12 illustrates the point discharge induced at the acute-angled area of a function electrode of a piezoelectric workpiece;

FIG. 13 illustrates the avoidance of point discharge at the acute-angled area of the function electrode of FIG. 12 in accordance with an embodiment of the present invention;

FIG. 16 illustrates the relative placement of an augmenting surface layer with respect to an arbitrary-shaped function electrode of a piezoelectric workpiece in accordance with an embodiment of the present invention; and FIG. 17 illustrates the relative placement of another augmenting surface layer with respect to the function electrode of the piezoelectric workpiece of FIG. 16 in accordance with an embodiment of the present invention.

DETAILED DESCRIPTION

Figure 3:
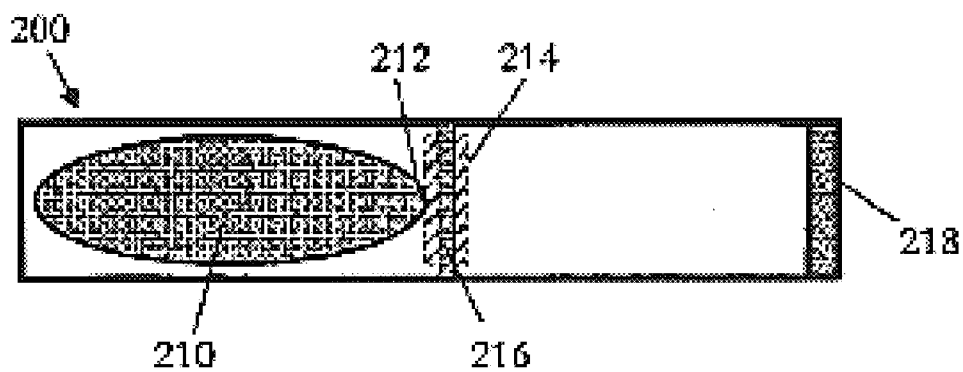
FIG. 3 is a top view illustrating the placement of an augmenting surface layer for a generally elliptically-shaped function electrode in accordance with an embodiment of the present invention.

The best modes of implementation of the fabrication of the piezoelectric workpiece of the present invention will be described in the following paragraphs.

In a perspective view, FIG. 1 schematically illustrates the abrupt alteration of the electric dipole polarization field inside the structural body of a piezoelectric workpiece in the region proximate to an acute-angled area of a function electrode. As is illustrated, a section 102 of a piezoelectric workpiece 100 is shown to have a function electrode 110 adhered to the top surface thereof. An opposite section 104 of the workpiece 100 at the right of section 102 has an end electrode 118, which is also a function electrode of the piezoelectric workpiece 100. Note that the perspective view of FIG. 1 is to schematically outline the general distribution of the internal electric dipole polarization and is therefore partially shown to be transparent.

For certain piezoelectric system design requirements, the function electrodes of a particular workpiece need to have contours with sharp-turning, or acute, angles. For example, the generally elliptical shape of the function electrode 110 in the vicinity of the region identified by reference numeral 112 in FIG. 1 is considered to be sharp-angled. Experiences show that such a sharp angle is likely to cause problem.

For a typical piezoelectric workpiece such as 100 of FIG. 1, the function electrode 110 is frequently paired with another electrode 111 adhered to the opposite (bottom) surface of the body of the workpiece having a shape contour as illustrated by the phantom-lines. Frequently when this paired electrode 111 is used as the common electrode for the electric circuit of the piezoelectric system, it typically has a rectangular shape.

In between the pair of electrodes 110 and 111, the crystalline grains of the body of the workpiece 100 are made to exhibit a gross electric dipole orientation generally orthogonal to the pair of electrodes, as is depicted in the drawing by the vertical arrows between the electrodes 110 and 111.

Meanwhile, orientation of electric dipoles within the workpiece body crystalline grains other than those between electrodes 110 and 111 is frequently, by design, different. Consider the case in which the piezoelectric workpiece 100 has another function electrode 118 to the far right of the body as shown in the drawing. Such a piezoelectric system design requires that the grains in the body region generally to the right of the electrode pair 110 and 111 to exhibit a gross electric dipole orientation different than that in the region between the pair. For example, the gross orientation may need to be substantially parallel to the longitudinal axis of the body of the workpiece, as is illustrated in the drawing by the horizontal arrows.

Thus, in the case of the workpiece of FIG. 1, there are at least two major electric dipole orientations inside the workpiece body structure. In the region generally indicated by reference numeral 114 where the two body sections of different electric dipole gross orientations meet, grains of the body material of the workpiece exhibit a different physical characteristics that is signified by the abrupt alteration of electric dipole moment from one orientation to the other. In the case of the piezoelectric workpiece design of FIG. 1, this orientation alteration is considered maximum practically at 90 degrees sweep from the vertical orientation in the region between the two electrodes 110 and 111 to horizontal in the region to the right.

The boundary region, as generally represented by the region 114, is itself drastically twisted. This is due to, and follows, the section of the general contour of the function electrode 110 proximate to the boundary region 114. These declivitous changes in the electric dipole orientation practically turn the boundary region 114 into a region of hot spots for accumulation of mechanical stress when the workpiece is operated to conduct mechanical/electrical energy conversion. In particular, stress hot spots arise in areas proximate to the sharp-angled regions of the function electrodes of the piezoelectric workpiece.

It is necessary to avoid, at least to smooth, the formation of regions with abrupt polarization orientation alterations inside the body of a piezoelectric workpiece. These regions may lead to mechanical stress concentrations and eventually result in structural failure, either during the manufacturing phase or normal operation of a piezoelectric workpiece.

In order to achieve this, in accordance with the present invention, augmenting electrically-conductive surface layers that can be used as electrodes during the fabrication phase of piezoelectric workpieces are implemented. As will be explained in the following description of the present invention, augmenting electrodes for a piezoelectric workpiece for this smoothing purpose are only effective during the fabrication stage of the workpiece. They are functionless during the normal operation of the piezoelectric workpiece. Alternatively, the present invention also proposes to use properly-shaped and properly-located fabrication-stage augmenting electrodes instead of permanent surface electrodes for achieving the inventive goal of boundary region smoothing.

FIG. 2 schematically illustrates the boundary region smoothing of the polarization field inside the structural body of a piezoelectric workpiece 200 of FIG. 1 in accordance with an embodiment of the present invention. The smoothing is in the region proximate to the acute-angled area of the function electrode. The smoothing is achieved via the use of an augmenting electrode 216 during the fabrication stage while the poling of the material grains between the two function electrodes 210 and 211 is in session.

Note that in the case of a piezoelectric workpiece such as the one depicted in FIG. 2, the augmenting electrode 216 in a preferred embodiment of the present invention has the shape of a generally-elongated and, frequently, straightened, or smoothly-curved, band. Such an augmenting band of electrode has its long edge substantially aligned with the corresponding edge of the rectangular-shaped function electrode 211 located on the opposite surface of the piezoelectric workpiece.

For the piezoelectric workpiece of the embodiment of the present invention as depicted in FIG. 2, poling of the vertical electric dipoles for the material grains in between the pair of function electrodes 210 and 211 is implemented with the participation of the augmenting electrode 216. Augmenting electrode 216 is electrically connected to the function electrode 210 during the poling operation. Together, the function electrode 210 and the augmenting electrode 216 constitute a gross electrode at the same electric potential that is paired with the corresponding electrode 211 located on the opposite surface of the workpiece. With the application of the high poling voltage across this gross electrode pair, electric dipoles of the grain molecules in the workpiece generally situated between the pair of gross poling electrodes are gradually turned to their desired (vertical) orientation.

With the presence of the augmenting electrode 216 during the poling stage of the fabrication, the drastically-twisted boundary region 114 in the case of FIG. 1 can be avoided. Instead, a smoothed region of boundary generally indicated by reference numeral 214 in FIG. 2 is formed as the poling operation is gradually performed. This smoothing is due to the presence of the augmenting electrode 216 in the general shape of an elongated and straightened band. Effectively, this straightened band 216 assists in smoothing the boundary region between the region of vertical poling orientation (generally between the function electrodes 210 and 211) and its neighboring region to the right (that usually has a horizontal polarization field).

Note, again, that the augmenting electrode 216 for the piezoelectric workpiece 200 of FIG. 2 is only functional during the fabrication phase in particular, the poling processing of the workpiece in the fabrication. As described, the augmenting electrode participates in turning the electric dipoles so that they align to the desired orientation with the smoothed boundary region contouring between sections of a piezoelectric workpiece required to have different bulk poling orientations. Afterwards, the smoothing augmenting electrode has no role when the workpiece is operated normally in a piezoelectric system.

Thus, in the case of the piezoelectric workpiece 200 of FIG. 2, while the augmenting electrode 216 can be fabricated as permanent electrode to reside on the top surface of the body, it can also be a temporary electrode. Such a temporary electrode can be pressedly attached to the workpiece 200 on its assigned and optimized location only during the poling processing stage of the fabrication phase. After the desired poling pattern is established inside the structural body of the workpiece, this temporary augmenting electrode can be removed, leaving no trace on the surface of the device at all. A couple of embodiments of the present invention employing this concept of temporary augmenting electrode are shown and described in FIGS. 3–7 as will be described in detail in the following paragraphs.

In this manner, the boundary region 214 is relatively smoothed when compared to the corresponding region 114 in the case of FIG. 1. This is due to the use of the augmenting electrode 216 when the workpiece is fabricated. The general contour of the augmenting electrode 216 proximate to the boundary region 214 is relatively uncurved it is in general in a straight line. This smoothed boundary region 214 practically avoids the accumulation of mechanical stress when the workpiece is operated to conduct mechanical/electrical energy conversion. Reliability of the workpiece is thus improved without mechanical stress hot spots.

FIG. 3 is a top view illustrating the placement of an augmenting surface layer for a generally elliptically-shaped function electrode in accordance with the embodiment of the present invention described in FIG. 2. As is shown in the top view, the function electrode 210 is generally elliptically shaped, with a sharp-angled end 212 close to the boundary region 214. The augmenting electrode 216 is fabricated permanently on the top surface of the workpiece 200 near the boundary region 212. The augmenting electrode 216 is fabricated substantially in the form of an elongated band. Such an augmenting band of electrode, when connected electrically to the function electrode 210 for poling during the fabrication phase of the workpiece 200, assists in easing and smoothing the boundary region 214 so that mechanical stress hot spots are avoided, both during the fabrication phase and normal operation of the workpiece.

Figure 4:
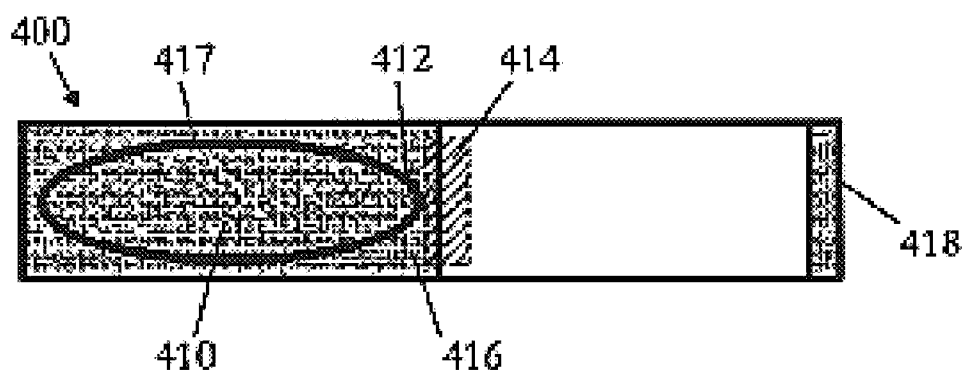
FIG. 4 is a top view illustrating the placement of another augmenting surface layer for the generally elliptically-shaped function electrode of FIG. 3 in accordance with an embodiment of the present invention.

FIG. 4 is a top view illustrating the placement of another augmenting surface layer for the generally elliptically-shaped function electrode of FIG. 3 in accordance with an embodiment of the present invention. As is illustrated, the function electrode 410 is also generally elliptically shaped, with a sharp-angled end 412 close to the boundary region 414. Although the augmenting electrode 416 is fabricated permanently on the top surface of the workpiece 400, but unlike in the case of FIGS. 2 and 3, electrode 416 is made to surround the entire function electrode 410. The augmenting electrode 416 is different from the augmenting electrode 216 of the workpiece of FIG. 2 in that the it is itself a closed loop that encircles the function electrode entirely. Note, however, that such full enclosure is not a necessary condition to achieve the smoothing of the boundary region as desired.

The augmenting electrode 416 and the function electrode 410 combined as a whole when implementing poling during the fabrication phase, the gross electrode (with electrodes 410 and 416 connected electrically to the same voltage) appears substantially equivalent to a rectangular electrode. This is despite the presence of the non-conducting band 417 separating the two electrodes. Such an encircling augmenting electrode 416, when connected electrically to the function electrode 410 for the implementation of poling of the workpiece 400, assists to achieve in the easing and smoothing of the boundary region 414.

Figure 5:
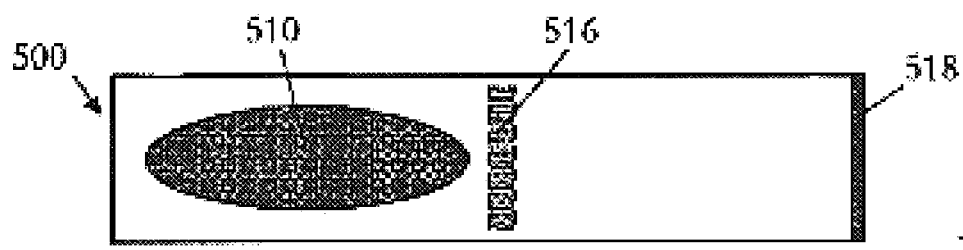
FIG. 5 is a top view illustrating the location of a fabrication-phase augmenting surface electrode on the surface of a piezoelectric workpiece having a generally elliptically-shaped function electrode in accordance with an embodiment of the present invention.

Thus, an augmenting electrode can be non-permanent but temporary. These temporary augmenting electrodes being required to be present in the body system of a workpiece and be functional only during the fabrication phase of the device. FIG. 5 is a top view illustrating the location of a fabrication-phase augmenting electrode on the surface of a piezoelectric workpiece in accordance with an embodiment of the present invention. This augmenting electrode 516 is non-permanent and has a shape similar to electrode 216 of FIGS. 2 and 3 described above.

Figure 7:
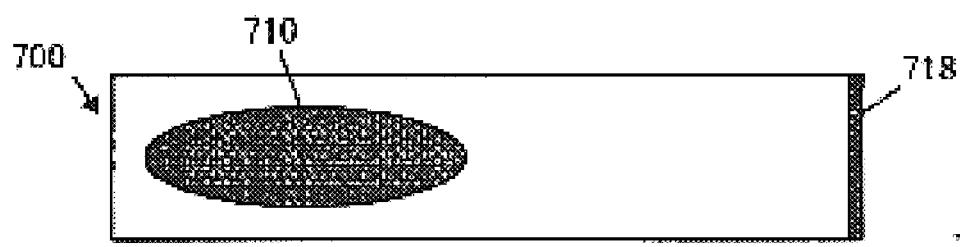
FIG. 7 is a top view illustrating the electrode pattern of the piezoelectric workpiece of FIGS. 5 and 6 after the completion of the fabrication phase thereof.

The augmenting electrode 516 can be considered as the non-permanent, or temporary, type of the corresponding permanent electrode 416 in the workpiece 400 of FIG. 4. The phantom-lined contour of electrode 516 in the drawing signifies the fact that it is only present during the fabrication phase of the workpiece, and is removed afterwards. FIG. 7 shows such a fabricated workpiece 500, which has only the function electrode left on the top surface of the device.

Figure 6:
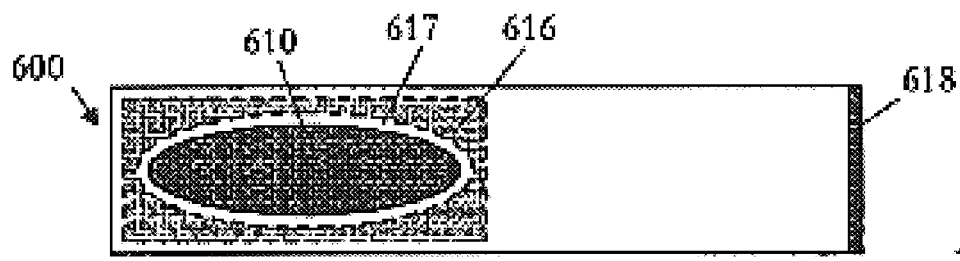
FIG. 6 is a top view illustrating the location of another fabrication-phase augmenting surface electrode on the surface of the piezoelectric workpiece having a generally elliptically-shaped function electrode of FIG. 5 in accordance with an embodiment of the present invention.

FIG. 6 is a top view illustrating the location of another fabrication-phase augmenting surface electrode on the surface of the piezoelectric workpiece in accordance with an embodiment of the present invention. This augmenting electrode 616 illustrated in phantom-lines is also non-permanent and has a shape similar to the augmenting electrode 416 of FIG. 4 described above. Similarly, the non-permanent augmenting electrode 616 is the temporary counterpart of electrode 416, and as its functionality is implemented during the fabrication phase of the workpiece 600, it is not seen on the top surface of the workpiece, as is illustrated in FIG. 7. FIG. 7 is a top view illustrating the electrode pattern of the piezoelectric workpiece of FIGS. 5 and 6 after the completion of the fabrication phase thereof.

Essentially, the two workpieces 500 and 600 of FIGS. 5 and 6, although employing their respective augmenting electrodes 516 and 616 during poling operation, are fabricated into workpieces of virtually the same appearance as shown in FIG. 7. The difference between the two being the internal poling characteristics that is not visible from the appearance of the workpieces.

FIG. 8 schematically illustrates the cross-section of a piezoelectric workpiece without the augmenting surface layer of the present invention. The drawing shows the various electrodes of a workpiece 800 connected to an electric circuit system 830 of the piezoelectric system 850 for driving a load 840. For example, the electrode 811, as a common electric node, is connected both to the circuit loops of the function electrode 810 and that of the function electrode 818 of the load 840. In a typical application in which the workpiece 800 is utilized as a piezoelectric transformer that picks up electrical energy from the DC power source 830 to drive an AC load 840 (such as a cold-cathode fluorescent light, CCFL, tube), the function electrode 810 is used as the actuating input electrode and the function electrode 818 as the output.

Without the participation of an augmenting electrode in the fabrication phase, such a prior-art piezoelectric device, as in FIG. 8 described above, has an electric dipole poling boundary region 814 that easily accumulates hot spots of mechanical stress. Such hot spots invite premature failure of the workpiece, either during the fabrication or the normal operation of the device.

In accordance with the teachings of the present invention as described in the previous paragraphs, a piezoelectric workpiece employing the concept of the inventive augmenting electrodes as outlined FIG. 9 can be free from such problems. FIG. 9 schematically illustrates a piezoelectric system 950 in which the workpiece is based on that of FIG. 8 and has incorporated onto itself an augmenting surface layer in accordance with an embodiment of the present invention. Compared to FIG. 8, an additional augmenting electrode 916 is added into the system 950 that smoothes the boundary region 914 between the two sections of different poling characteristics.

Note, as the drawing shows clearly, the augmenting electrode 916 does not take part in the operating mode of the workpiece 900. This is clearly illustrated as the electrode 916 is left unconnected electrically in the electrical circuit of the system 950. Also, FIG. 9 only shows an application mode of the workpiece 900 as it is connected in a mechanical/electrical system 950. Note here that the workpiece 900 has incorporated a permanent type of augmenting electrode 916 on its surface.

Figure 10:
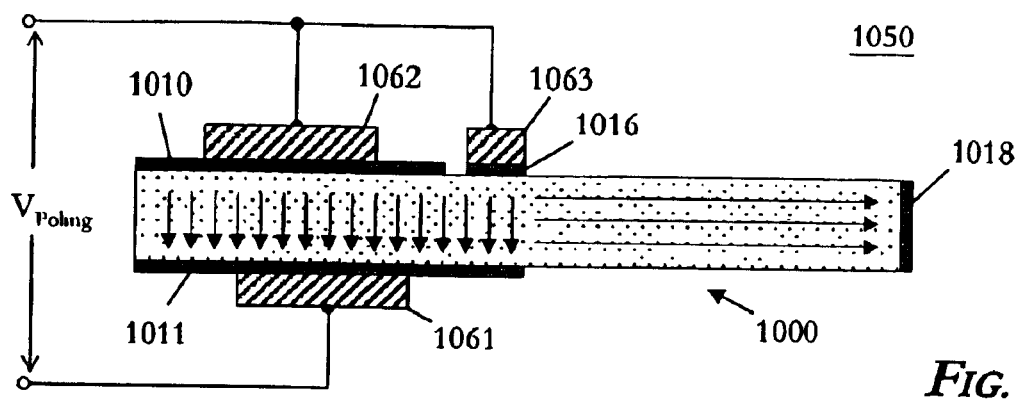
FIG. 10 is a cross-sectional view illustrating the contact of poling electrodes with both the function and the augmenting surface electrodes in accordance with an embodiment of the present invention.

FIG. 10 is a cross-sectional view illustrating the contact of poling electrodes with both the function and the augmenting surface electrodes in accordance with an embodiment of the present invention. During the poling phase of the fabrication of the workpiece 1000, the function electrode 1010 and the augmenting electrode 1016 are electrically connected together. This common node is then paired with the node of the electrode 1011, and the pair of nodes is connected across the poling voltage $V_{Poling}$. To do this, contact electrodes 1061, 1062 and 1063 are used. As is shown in the drawing, contact electrodes 1061, 1062 and 1063 are pressed with adequate force onto the surface of their respective function electrodes 1011, 1010 and 1016.

Since the electrical contact of the contact electrodes with their respective workpiece surface electrodes is only necessary during the poling phase of the device, such contacts are therefore temporary in nature. A reasonable scheme to implement these contacts is via the use of adequate fabrication fixture that presses these contact electrodes onto the surface of the workpiece 1000, as is comprehensible to those skilled in the art. Also, as is comprehensible, such poling contacts need to be made under sufficient mechanical pressure to ensure adequate electrical contact between the poling electrodes and their respective function/augmenting electrodes.

Figure 11:
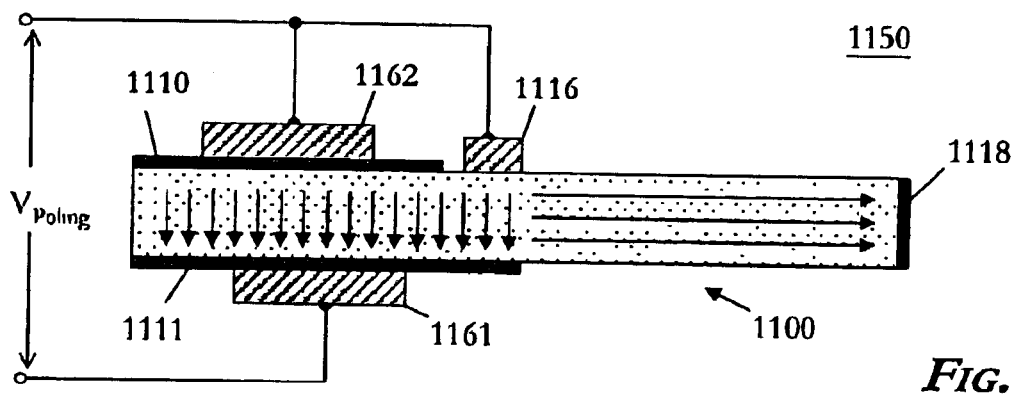
FIG. 11 is a cross-sectional view illustrating the contact of a poling electrode that is used directly as an augmenting surface layer in accordance with an embodiment of the present invention.

By contrast, FIG. 11 is a cross-sectional view illustrating the contact of a poling electrode that is used directly as an augmenting surface layer in accordance with an embodiment of the present invention. In this described embodiment of the present invention, since there is no permanent and physical augmenting electrode fabricated onto the corresponding location on the surface of the workpiece 1100, the augmenting poling electrode 1116 is directly pressed onto the surface of the device.

FIG. 12 illustrates the point discharge induced at the acute-angled area of a function electrode of a piezoelectric workpiece. As mentioned, such point discharges are likely to occur across the electrodes used for polarization processing. FIG. 12 depicts a function electrode 1210 having a contour with sharp-pointed ends. When a point discharge takes place, at the electrode end 1212 near the center of the workpiece 1200 in particular, the workpiece 1200 is likely to be broken into pieces, which is a fatal result. The surge current in association with a point discharge across the tipped end 1212 of the function electrode 1210 and the corresponding electrode 1211 gives rise to an abrupt increase in local body mechanical stress along the path of the discharge current. Frequently, such an abrupt regional stress increase breaks up the workpiece into pieces.

FIG. 13 illustrates the avoidance of point discharge at the acute-angled area of the function electrode of FIG. 12 in accordance with an embodiment of the present invention. An augmenting electrode 1316 can be placed near the tipped end 1312 of the workpiece 1300 so as to disperse the accumulation of electrical charges, as is illustrated in the drawing. Note that this augmenting electrode 1316 is also capable of serving the function of smoothing the polarization boundary region as described above.

Thus, augmenting electrodes in accordance with the present invention are useful for preventing premature failure of a piezoelectric workpiece while not affecting the functional usefulness of the workpiece in a piezoelectric system. Although the augmenting electrodes described so far are mainly useful during the fabrication phase of a piezoelectric workpiece, however, as can be seen in the following paragraphs, an additional usefulness of the augmenting electrode of the present invention can be found during the normal operation of a workpiece.

Figure 14:
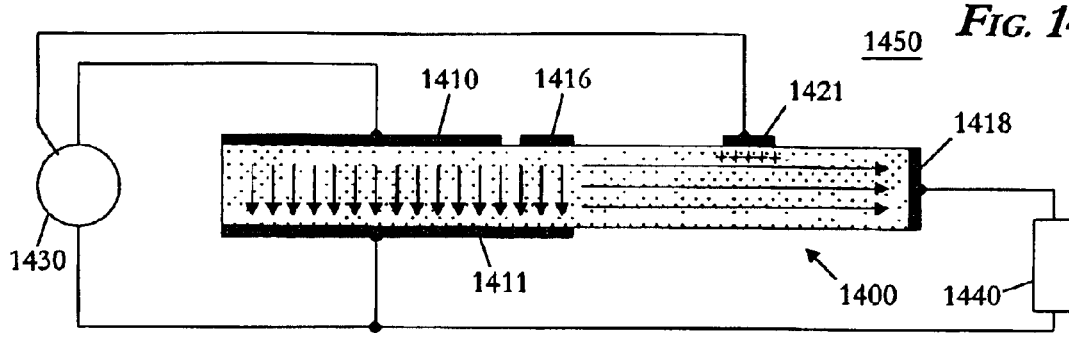
FIG. 14 illustrates the piezoelectric workpiece of FIG. 9 having an additional function electrode.

FIG. 14 illustrates the piezoelectric workpiece of FIG. 9 having an additional function electrode. The use of this functional electrode 1421 on the body surface of the workpiece 1400 is per design requirement of the piezoelectric system 1450. For example, if the piezoelectric system 1450 is engaged in a transformer application as described above, a feedback node 1421 essentially another function electrode is fabricated to the desired location on the surface of the workpiece 1400. As is comprehensible, this feedback node 1421 can be used to pickup up signal of the workpiece 1400 for feedback to the electric circuit 1430 for, for example, implementing a closed-loop control scheme in a power transforming application.

The use of such a function electrode, which is relatively isolated spatially, is likely to accumulate electric charges to a level dangerous to the workpiece itself when the operation of the system is prolonged in time. Sufficient accumulations of electric charges on such function electrodes as 1421 of the system 1450 of FIG. 14 had been observed to cause catastrophic results breakage of the piezoelectric workpiece into pieces.

Figure 15:
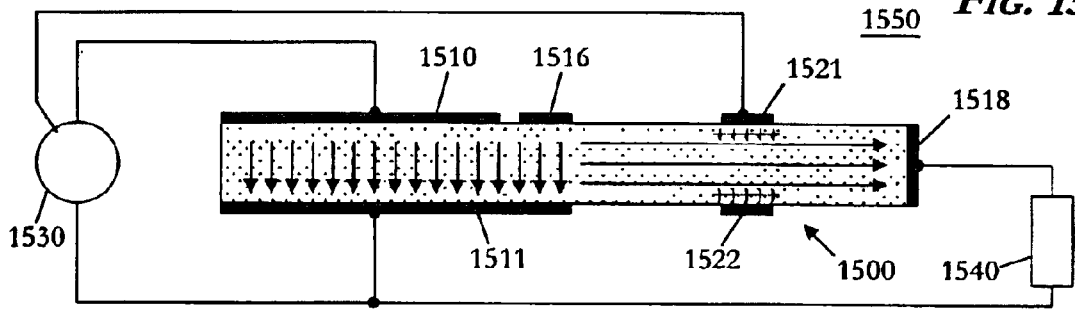
FIG. 15 illustrates the piezoelectric workpiece of FIG. 14 having incorporated another augmenting surface layer in accordance with an embodiment of the present invention.

FIG. 15 illustrates the piezoelectric workpiece of FIG. 14 having incorporated another augmenting surface layer in accordance with an embodiment of the present invention. The use of an additional augmenting electrode 1522 in the system 1550 is advantageous in preventing these operational failures. An augmenting electrode 1522 for an isolated function electrode such as 1521 of FIG. 15 is located at a surface location of the workpiece 1500 substantially opposite to the location of the electrode 1521. This establishes a symmetry. The symmetry provided by this augmenting electrode 1521 for the spatially isolated function electrode 1521 is believed to have concealed the effect of biased electric charge accumulation around the spatially isolated electrode 1421 as illustrated in FIG. 14. The augmenting electrode 1522 in the case of FIG. 15 is able to invite the accumulation of its own electric charges around itself.

Such induced charge accumulation around augmenting electrode 1522 due to that of the function electrode 1521 is believed to have allowed the evening of the mechanical stress in the vicinity of these electrodes. Experimental results had shown the usefulness of these augmenting electrodes in preventing breaking of workpieces with spatially-isolated function electrodes such as for feedback signal pickup. It is necessary to also mention that experimental results had also confirmed the usefulness of augmenting electrodes in accordance with the teachings of the present invention in preventing workpiece breaking during the poling processing of the fabrication phase.

For a general rule of implementing an augmenting electrode of the present invention for a piezoelectric workpiece in pursuit of improved device reliability, FIGS. 16 and 17 provide a couple of examples. FIG. 16 illustrates the relative placement of an augmenting surface layer 1616 with respect to a relatively irregularly-shaped function electrode 1610 of a piezoelectric workpiece 1600 in accordance with an embodiment of the present invention. On the other hand, FIG. 17, in accordance with an embodiment of the present invention, illustrates the relative placement of another augmenting surface layer 1716 with respect to the function electrode 1710 of the piezoelectric workpiece 1700 that is virtually the same as that of FIG. 16.

In general, the overall shape of an augmenting electrode at the edge opposite to that facing the function electrode it is intended to augment is required to have a contour as smooth as possible. This is illustrated in the embodiments as outlined in FIGS. 16 and 17. Specifically, the outer edge of the augmenting electrode 1616 is substantially circular. In the case of FIG. 17, the outer edge of the augmenting electrode 1716 is also circular, although its inner edge is as irregular as the contour of its augmented function electrode 1710.

Thus, a piezoelectric workpiece to be connected in an electric circuit for energy conversion between electrical and mechanical forms in a piezoelectric system in accordance with a preferred embodiment of the present invention would comprise a body, a number of function electrodes, and at least an augmenting surface electrode. Note that the augmenting surface electrode in such embodiment of the invention is a permanent electrode, even though its smoothing functionality is only effective during the fabrication phase of the workpiece.

The body of piezoelectricity is for implementing the energy conversion. The function electrodes are each fixedly attached to the surface of the body, and the function electrodes are connected in the electric circuit for implementing the energy conversion. At least one of the function electrodes has a shape with a contour of at least one acute angle. At least an augmenting surface electrode has a substantially elongated shape fixedly attached to the surface of the body proximate to the acute angle. The augmenting surface electrode and the proximate function electrode thereof constitute a gross electrode that substantially cancels the acute angle when both are connected electrically to the same electric potential. The acute angle is cancelled during the polarization of electric dipoles of the body grain molecules so that the boundary region between different polarization orientation distribution regions can be smoothed. As a result, the reliability of the piezoelectric workpiece is improved both during the fabrication and during normal operation of the workpiece.

In accordance with an alternate concept of the present invention, the augmenting layer is temporary. Based on such an embodiment, a piezoelectric workpiece comprises a body and a number of function electrodes. The body of piezoelectricity is for implementing the energy conversion; and the function electrodes are each fixedly attached to the surface of the body. The function electrodes are connected in the electric circuit for implementing the energy conversion. At least one of the function electrodes has a shape with a contour of at least one acute angle, wherein at least a polarization augmenting electrode is pressed onto the surface of the body proximate to the acute angle during the fabrication of the piezoelectric workpiece. The polarization augmenting electrode and the proximate function electrode thereof constitute a gross electrode when connected electrically together. Similar as in the case of a permanent augmenting electrode, the gross electrode substantially cancels the acute angle when paired with one of the function electrodes and connected to a polarization voltage. The polarization voltage polarizes electric dipoles of grain molecules of the body in between the pair during fabrication of the piezoelectric workpiece so that the boundary region between different polarization orientation distribution regions within the piezoelectric workpiece are smoothed without any acute angle.

In accordance with the present invention, the method for fabricating a piezoelectric workpiece having permanent augmenting electrode would comprise at least the following steps. First, a body of piezoelectricity for implementing the energy conversion needs to be made. Then, a number of function electrodes are formed on the surface of the body. The function electrodes will be connected in the electric circuit for implementing the energy conversion. Among the function electrodes, at least one has a shape with a contour of at least one acute angle. At least one polarization augmenting electrode is also formed on the surface of the body proximate to the acute angle. The polarization augmenting electrode and the proximate function electrode thereof constitute a gross electrode when connected electrically together. Next, electric dipoles of grain molecules of the body are polarized utilizing the gross electrode, which substantially cancels the acute angle when paired with one of the function electrodes and connected to a polarization voltage for implementing the polarization. The polarization voltage polarizes electric dipoles of grain molecules of the body in between the pair so that the boundary region between different polarization orientation distribution regions within the piezoelectric workpiece are smoothed without any acute angle.

An alternative method in accordance with the present invention that does not rely on a permanent augmenting electrode to achieve smoothing is also possible. Instead of permanent augmenting electrodes, temporary and equivalent electrodes can be used. The method comprises at least the following steps. First, a body of piezoelectricity for implementing the energy conversion is made. Then, a number of function electrodes are formed on the surface of the body. Among the function electrodes, at least one has a shape with a contour of at least one acute angle. Then, electric dipoles of grain molecules of the body are polarized utilizing at least a polarization augmenting electrode pressed onto the surface of the body proximate to the acute angle. The polarization augmenting electrode and the proximate function electrode thereof constitutes a gross electrode when connected electrically together. Likewise, the gross electrode substantially cancels the acute angle when paired with one of the function electrodes and connected to a polarization voltage for implementing the polarization. The polarization voltage thus may be allowed to polarize electric dipoles of grain molecules of the body in between the pair so that the boundary region between different polarization orientation distribution regions within the piezoelectric workpiece are smoothed without any acute angle.

Although the invention has been described in considerable detail with reference to certain preferred versions thereof, other versions are possible. For example, although the drawings used for the description of the preferred embodiment of the present invention include only Rosen type and a couple of other designs, it is not the intention of the present invention to be limited to these specific types of piezoelectric workpieces. Further, although generally-elliptically-shaped function electrodes are employed in the drawings, they are not intended for the limitation to the scope of the present invention. Therefore, the spirit and scope of the appended claims should not be limited to the description of the preferred versions contained herein.

What is claimed is:

1. A piezoelectric workpiece for electrically connected in an electric circuit for energy conversion between electrical and mechanical forms in a piezoelectric system, said piezoelectric workpiece comprising:

a body of piezoelectricity for implementing said energy conversion;

a plurality of function electrodes each fixedly attached to the surface of said body, said plurality of function electrodes being connected in said electric circuit for implementing said energy conversion; and at least one of said function electrodes having a shape with a contour of at least one acute angle; and at least an augmenting surface electrode fixedly attached to the surface of said body proximate to said acute angle, said augmenting surface electrode and said proximate function electrode thereof constituting a gross electrode substantially canceling said acute angle when connected electrically to the same electric potential.

2. The piezoelectric workpiece of claim 1, wherein said at least one augmenting surface electrode has a shape that is substantially elongated.

3. The piezoelectric workpiece of claim 2, wherein said at least one augmenting surface electrode of substantially elongated shape has at least one smooth edge opposite to said acute angle of said proximate function electrode.

4. The piezoelectric workpiece of claim 1, wherein said at least one augmenting surface electrode has a shape that is substantially a closed-loop ring surrounding said proximate function electrode.

5. The piezoelectric workpiece of claim 4, wherein said at least one augmenting surface electrode of substantially closed-loop ring has at least one smooth edge opposite to said acute angle of said proximate function electrode.

6. A piezoelectric workpiece for electrically connected in an electric circuit for energy conversion between electrical and mechanical forms in a piezoelectric system, said piezoelectric workpiece comprising:

a body of piezoelectricity for implementing said energy conversion; and a plurality of function electrodes each fixedly attached to the surface of said body, said plurality of function electrodes being connected in said electric circuit for implementing said energy conversion; at least one of said function electrodes having a shape with a contour of at least one acute angle; wherein at least a polarization augmenting electrode being pressed onto the surface of said body proximate to said acute angle during the fabrication of said piezoelectric workpiece;

said polarization augmenting electrode and said proximate function electrode thereof constituting a gross electrode when connected electrically together, said gross electrode substantially canceling said acute angle when paired with one of said function electrodes and connected to a polarization voltage; and said polarization voltage polarizing electric dipoles of grain molecules of said body in between said pair during said fabrication of said piezoelectric workpiece so that the boundary region between different polarization orientation distribution regions within said piezoelectric workpiece are smoothed without any acute angle.

7. The piezoelectric workpiece of claim 6, wherein said at least one polarization augmenting electrode has a shape that is substantially elongated.

8. The piezoelectric workpiece of claim 7, wherein said at least one polarization augmenting electrode of substantially elongated shape has at least one smooth edge opposite to said acute angle of said proximate function electrode.

9. The piezoelectric workpiece of claim 6, wherein said at least one polarization augmenting electrode has a shape that is substantially a closed-loop ring surrounding said proximate function electrode.

10. The piezoelectric workpiece of claim 9, wherein said at least one polarization augmenting electrode of substantially closed-loop ring has at least one smooth edge opposite to said acute angle of said proximate function electrode.

11. The piezoelectric workpiece of claim 6, wherein said at least one polarization augmenting electrode is pressed onto the surface of said body only during said fabrication and is removed after said fabrication.

* * * * *